US012666967B2

(12) United States Patent
McCallum-Cook et al.

(10) Patent No.: US 12,666,967 B2
(45) Date of Patent: Jun. 23, 2026

(54) SEAL RINGS FOR A WIDE BAND-GAP SEMICONDUCTOR LAYER STACK

(71) Applicant: GlobalFoundries U.S. Inc., Malta, NY (US)

(72) Inventors: Ian McCallum-Cook, Burlington, VT (US); Mark Levy, Williston, VT (US); Zhong-Xiang He, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 448 days.

(21) Appl. No.: 18/242,906

(22) Filed: Sep. 6, 2023

(65) Prior Publication Data

US 2025/0079345 A1 Mar. 6, 2025

(51) Int. Cl.
　　H01L 23/58　　(2006.01)
　　H10W 42/00　　(2026.01)
　　　　　　(Continued)

(52) U.S. Cl.
　　CPC ......... H10W 42/00 (2026.01); H10W 74/134 (2026.01); H10W 74/147 (2026.01);
　　　　　　(Continued)

(58) Field of Classification Search
　　CPC . H10W 42/00; H10W 74/134; H10W 74/147; H10W 74/43; H10W 42/121;
　　　　　　(Continued)

(56) References Cited

U.S. PATENT DOCUMENTS 10,249,506 B2 　 4/2019 　 Macelwee et al.
10,283,501 B2 　 5/2019 　 Macelwee et al.
　　　　　　(Continued)

FOREIGN PATENT DOCUMENTS

EP 　 4113627 A1 　 1/2023

OTHER PUBLICATIONS

Li, Xiangdong et al,. "200 V Enhancement-mode p-GaN HEMTs Fabricated on 200 mm GaN-on-SOI with Trench Isolation for Monolithic Integration." (2017) IEEE Electron Device Letters. pp. 1-1. 10.1109/LED.2017.2703304.
　　　　　　(Continued)

*Primary Examiner* — Cuong B Nguyen
(74) *Attorney, Agent, or Firm* — Thompson Hine LLP; Francois Pagette

(57) ABSTRACT

Structures including a wide band-gap semiconductor layer stack and methods of forming such structures. The structure comprises a layer stack on a substrate and a first dielectric layer on the layer stack. The layer stack includes semiconductor layers that comprise a wide band-gap semiconductor material. A seal ring includes a trench that penetrates through the first dielectric layer and the layer stack to the substrate, a second dielectric layer that lines the trench, and a conductor layer including first and second portions inside the trench. The trench surrounds portions of the layer stack and the first dielectric layer. The second dielectric layer includes a first portion disposed between the first portion of the conductor layer and the portion of the layer stack, and the second dielectric layer includes a second portion disposed between the second portion of the conductor layer and the portion of the first dielectric layer.

20 Claims, 9 Drawing Sheets

(51) Int. Cl.

| | |
|---|---|
| *H10W 74/10* | (2026.01) |
| *H10D 30/47* | (2025.01) |
| *H10D 62/85* | (2025.01) |
| *H10W 74/43* | (2026.01) |

(52) U.S. Cl.
CPC ....... *H10D 30/475* (2025.01); *H10D 62/8503* (2025.01); *H10W 74/43* (2026.01)

(58) Field of Classification Search
CPC . H10W 74/01; H10D 30/475; H10D 62/8503; H10D 62/117
See application file for complete search history.

(56) References Cited

U.S. PATENT DOCUMENTS

| | | | |
|---|---|---|---|
| 2018/0012770 A1 | 1/2018 | Macelwee et al. | |
| 2019/0019770 A1 | 1/2019 | Chang et al. | |
| 2021/0167165 A1* | 6/2021 | Chou .................. | H10D 30/475 |
| 2021/0265167 A1* | 8/2021 | Zhao .................. | H10D 30/475 |

OTHER PUBLICATIONS

R. Sun, J. Lai, W. Chen and B. Zhang, "GaN Power Integration for High Frequency and High Efficiency Power Applications: A Review," in IEEE Access, vol. 8, pp. 15529-15542, 2020, doi: 10.1109/ACCESS.2020.2967027.

X. Li et al., "GaN-on-SOI: Monolithically Integrated All-GaN ICs for Power Conversion," 2019 IEEE International Electron Devices Meeting (IEDM), San Francisco, CA, USA, 2019, pp. 4.4.1-4.4.4, doi: 10.1109/IEDM19573.2019.8993572.

Susai, Lawrence Selvaraj et al., "Compound Semiconductor-Based Devices With Stress-Reduction Features" filed on Jul. 14, 2022 as a U.S. Appl. No. 17/864,499.

Levy, Mark D. et a., "Seal Ring Structures" filed on Jan. 10, 2023 as a U.S. Appl. No. 18/095,156.

Cucci, Brett et a., "Stress-Reduction Structures for a Compound Semiconductor Layer Stack" filed on Aug. 11, 2023 as a U.S. Appl. No. 18/232,876.

European Patent Office, Extended European Search Report and Opinion issued in European Patent Application No. 24161325.6 on Aug. 6, 2024; 8 pages.

* cited by examiner

SEAL RINGS FOR A WIDE BAND-GAP SEMICONDUCTOR LAYER STACK

STATEMENT REGARDING FEDERALLY SPONSORED RESEARCH OR DEVELOPMENT

This invention was made with government support under HQ0727790700 awarded by the Defense Microelectronics Activity. The government has certain rights in the invention.

BACKGROUND

The present disclosure relates to semiconductor device fabrication and integrated circuits and, more specifically, to structures including a wide band-gap semiconductor layer stack and methods of forming such structures.

Compound semiconductor-based devices, such as high-electron-mobility transistors, may be deployed in high-voltage power electronics. Compound semiconductors are characterized by material properties, such as a carrier mobility that is greater than the carrier mobility of silicon and a wider band gap than silicon, that can be exploited. Compound semiconductors may include Group III elements (e.g., aluminum, gallium, and/or indium) and Group V elements (e.g., nitrogen, phosphorus, arsenic, and/or antimony) combined with the Group III elements. A common compound semiconductor employed in constructing compound semiconductor-based devices is gallium nitride. A high-electron-mobility transistor may include a heterojunction between crystalline compound semiconductor materials having different band gaps, such as a heterojunction between binary gallium nitride and trinary aluminum-gallium nitride. During operation, a two-dimensional electron gas formed near the heterojunction defines the channel of the high-electron-mobility transistor.

A compound semiconductor-based device may include a stack of compound semiconductor layers that are epitaxially grown on a substrate. The compound semiconductor layers are optimized in order to manage stresses caused by, for example, differences in the coefficient of thermal expansion between the substrate and the stack of compound semiconductor layers. Nevertheless, thermal steps during subsequent processing may result in cracking and/or breakage.

Improved structures including a wide band-gap semiconductor layer stack and methods of forming such structures are needed.

SUMMARY

In an embodiment of the invention, a structure comprises a layer stack on a substrate and a first dielectric layer on the layer stack. The layer stack includes a plurality of semiconductor layers, and each semiconductor layer comprises a wide band-gap semiconductor material. The structure further comprises a seal ring including a trench that penetrates through the first dielectric layer and the layer stack to the substrate, a second dielectric layer that lines the trench, and a conductor layer including a first portion and a second portion inside the trench. The trench surrounds a portion of the layer stack and a portion of the first dielectric layer. The second dielectric layer includes a first portion disposed between the first portion of the conductor layer and the portion of the layer stack, and the second dielectric layer includes a second portion disposed between the second portion of the conductor layer and the portion of the first dielectric layer.

In an embodiment of the invention, a method comprises forming a layer stack on a substrate and forming a first dielectric layer on the layer stack. The layer stack includes a plurality of semiconductor layers, and each semiconductor layer comprises a wide band-gap semiconductor material. The method further comprises forming a seal ring including a trench that penetrates through the first dielectric layer and the layer stack to the substrate, a second dielectric layer that lines the trench, and a conductor layer including a first portion and a second portion inside the trench. The trench surrounds a portion of the layer stack and a portion of the first dielectric layer, the second dielectric layer includes a first portion disposed between the first portion of the conductor layer and the portion of the layer stack, and the second dielectric layer includes a second portion disposed between the second portion of the conductor layer and the portion of the first dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
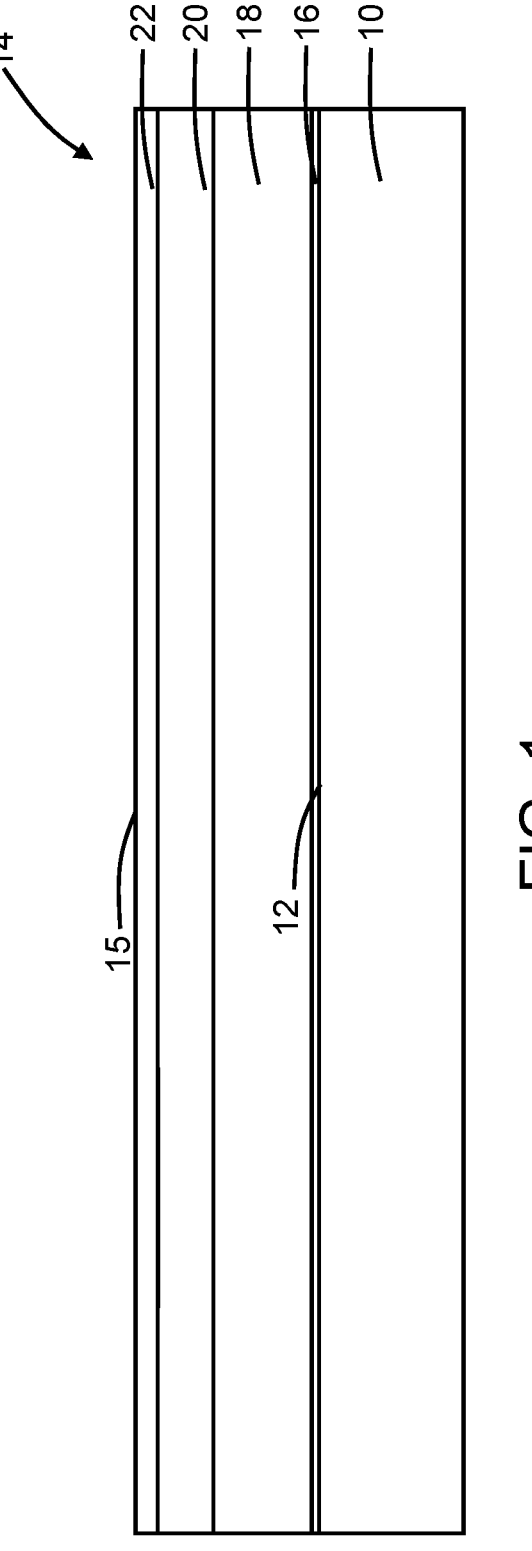
FIG. 1 is a cross-sectional view of a structure at an initial fabrication stage of a processing method in accordance with embodiments of the invention.

With reference to FIG. 1 and in accordance with embodiments of the invention, a layer stack 14 is formed on the top surface 12 of a substrate 10. The substrate 10 may be comprised of a single-crystal semiconductor material, such as single-crystal silicon. The substrate 10 may be a bulk substrate that contains a single-crystal semiconductor material (e.g., single-crystal silicon). In an embodiment, the single-crystal semiconductor material of the substrate 10 may have a diamond crystal lattice structure with a <111> crystal orientation as specified by Miller indices. In alternative embodiments, the substrate 10 may be comprised of a different material, such as silicon carbide.

The layer stack 14 may include a seed layer 16, a buffer layer 18, a channel layer 20, and a donor layer 22 each containing one or more compound semiconductor materials. The seed layer 16 provides a thin nucleation layer for the growth of the buffer layer 18 and may be comprised of, for example, aluminum nitride. The layers 16, 18, 20, 22 may be serially deposited using an epitaxial growth process, such as metalorganic chemical vapor deposition, vapor phase epitaxy, or molecular beam epitaxy, to form the layer stack 14. The layer stack 14 may have a thickness, for example, on the order of five microns. The channel layer 20 is disposed over the buffer layer 18, which is tailored in terms of material composition, doping, layering, and/or layer thickness to accommodate lattice mismatch, thermal property differences, and mechanical property differences between the material of the substrate 10 and the material of the channel layer 20. The donor layer 22 is disposed over the channel layer 20.

The layers 16, 18, 20, 22 of the layer stack 14 may each have a crystal structure that is single crystal or, alternatively, a crystal structure that is substantially single crystal with varying levels of crystalline defectivity present. Each of the layers 16, 18, 20, 22 of the layer stack 14 may be comprised of a semiconductor material characterized by a wide band gap that is greater than the band gap of silicon. Exemplary wide band-gap semiconductor materials include, but are not limited to, III-V compound semiconductor materials and II-VI compound semiconductor materials. The buffer layer 18 may be comprised of one or more binary or ternary III-V compound semiconductor materials, such as gallium nitride, aluminum nitride, aluminum gallium nitride, or a combination of these materials. The channel layer 20 may be comprised of, for example, a binary III-V compound semiconductor material, such as gallium nitride, doped with carbon or iron. The donor layer 22 may be comprised of a ternary III-V compound semiconductor, such as aluminum gallium nitride, that provides a heterogenous interface with the buffer layer 18 of different composition. The channel layer 20 may include a layer comprised of undoped gallium nitride adjacent to the donor layer 22, and an optional barrier layer comprised of, for example, aluminum nitride may be located between the channel layer 20 and the donor layer 22.

Figure 2:
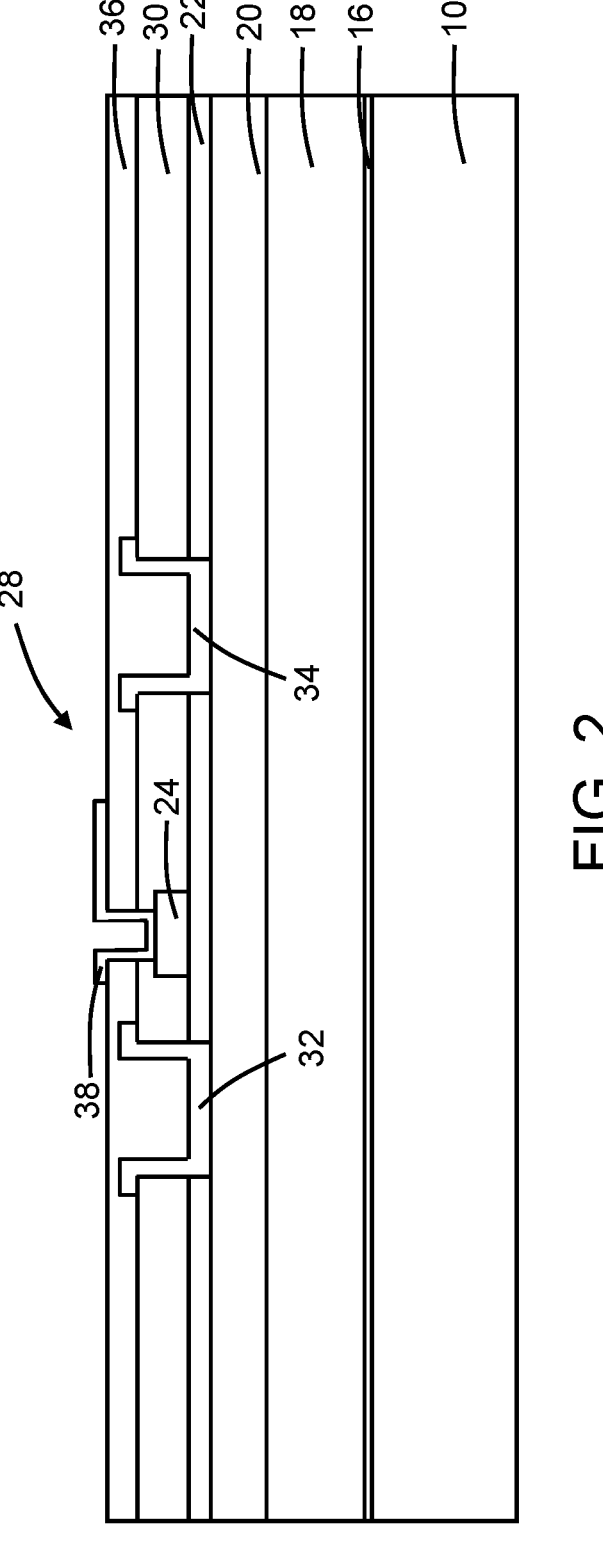
FIG. 2 is a cross-sectional view of the structure at a fabrication stage of the processing method subsequent to FIG. 1.

With reference to FIG. 2 in which like reference numerals refer to like features in FIG. 1 and at a subsequent fabrication stage, a gate 26 of an exemplary compound-semiconductor-based device, such as a high-electron-mobility transistor 28, may be positioned on the top surface 15 of the layer stack 14. The gate 24 may be formed by depositing a layer comprised of a III-V compound semiconductor material on the layer stack 14 and patterning the deposited layer by lithography and etching processes. The gate 26 may include a gate electrode comprised of, for example, titanium nitride as an upper portion disposed over a lower portion comprised of the III-V compound semiconductor material.

A dielectric layer 30 is formed over the gate 26 and the top surface 15 of the layer stack 14. The dielectric layer 30 may be comprised of a dielectric material, such as silicon dioxide, that is an electrical insulator, or a stack of dielectric materials, such a layer stack of silicon dioxide and aluminum oxide. The dielectric layer 30 may be deposited and then planarized by chemical-mechanical polishing to eliminate topography. The gate 26 is embedded in the dielectric layer 30.

The high-electron-mobility transistor 28 may include a source ohmic contact 32 and a drain ohmic contact 34 that are formed on different portions of the layer stack 14. The source ohmic contact 32 and the drain ohmic contact 34 may be formed in recesses penetrating through the dielectric layer 30 and the donor layer 22 to the channel layer 20. In an embodiment, the source ohmic contact 32 and drain ohmic contact 34 may comprise an ohmic metal, such as titanium, titanium nitride, aluminum, silicon, or a combination of these materials.

The gate 26 is positioned in a lateral direction between the source ohmic contact 32 and the drain ohmic contact 34. A dielectric layer 36 may be formed over the dielectric layer 30, and gate metal 38 may be formed that is disposed in an opening patterned in the dielectric layer 36 and atop the gate 26. The gate metal 38 may include a field plate that extends in a lateral direction toward the drain ohmic contact 34. The high-electron-mobility transistor 28 also includes portions of the channel layer 20 and donor layer 22 of the layer stack 14 in which the two-dimensional electron gas (2DEG) is formed during operation.

Figure 3:
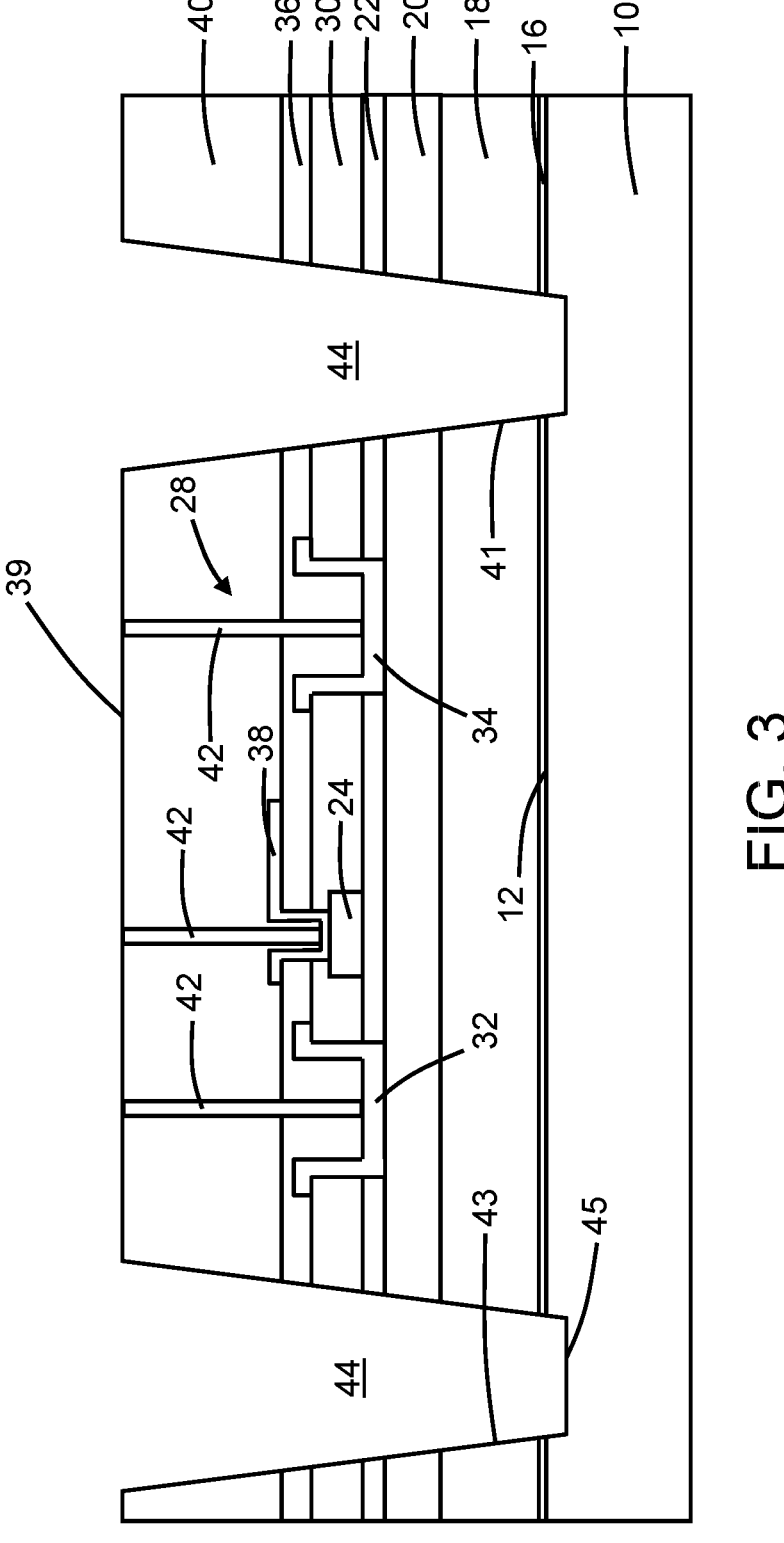
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage, a dielectric layer 40 may be formed over the high-electron-mobility transistor 28 and the dielectric layer 36. Contacts 42 may be formed in the dielectric layer 40 that extend to the source ohmic contact 32, the drain ohmic contact 34, and the gate metal 38. The contacts 42 may be comprised of a metal, such as tungsten, and may be formed in contact openings patterned by lithography and etching processes in the dielectric layer 40.

A trench 44 may be patterned by lithography and etching processes that surrounds a portion of the layer stack 14 and portions of the dielectric layers 30, 36, 40 on the portion of the layer stack 14. The trench 44 has an inner sidewall 41 and an outer sidewall 43 that extend fully through the dielectric layers 30, 36, 40 and the layer stack 14. In an embodiment, the trench 44 may penetrate past the top surface 12 of the substrate 10 and include a lower portion with a bottom 45 disposed at a shallow depth in the substrate 10. In an embodiment, the bottom 45 of the trench 44 may be coextensive with the top surface 12 of the substrate 10 and thereby the trench 44 may be disposed fully above the top surface 12. The inner sidewall 41 is disposed between the outer sidewall 43 and the portion of the layer stack 14 that is surrounded by the trench 44, and the inner sidewall 41 is also disposed between the outer sidewall 43 and the portions of the dielectric layers 30, 36, 40 that are surrounded by the trench 44.

In an embodiment, the trench 44 may be tapered with a depth-dependent width that is largest at a top surface 39 of the dielectric layer 40 and that varies with depth relative to the top surface 39. In an embodiment, the trench 44 may be tapered with a width that decreases with decreasing distance from the bottom 45. In an embodiment, the trench 44 may be tapered with a width that decreases with increasing distance from the top surface 39 of the dielectric layer 40. In an embodiment, the trench 44 may have a width at its entrance of about four microns. In an embodiment, the trench 44 may be tapered with a width that decreases with decreasing distance from the bottom 45 and that is characterized by different taper angles.

Figure 4:
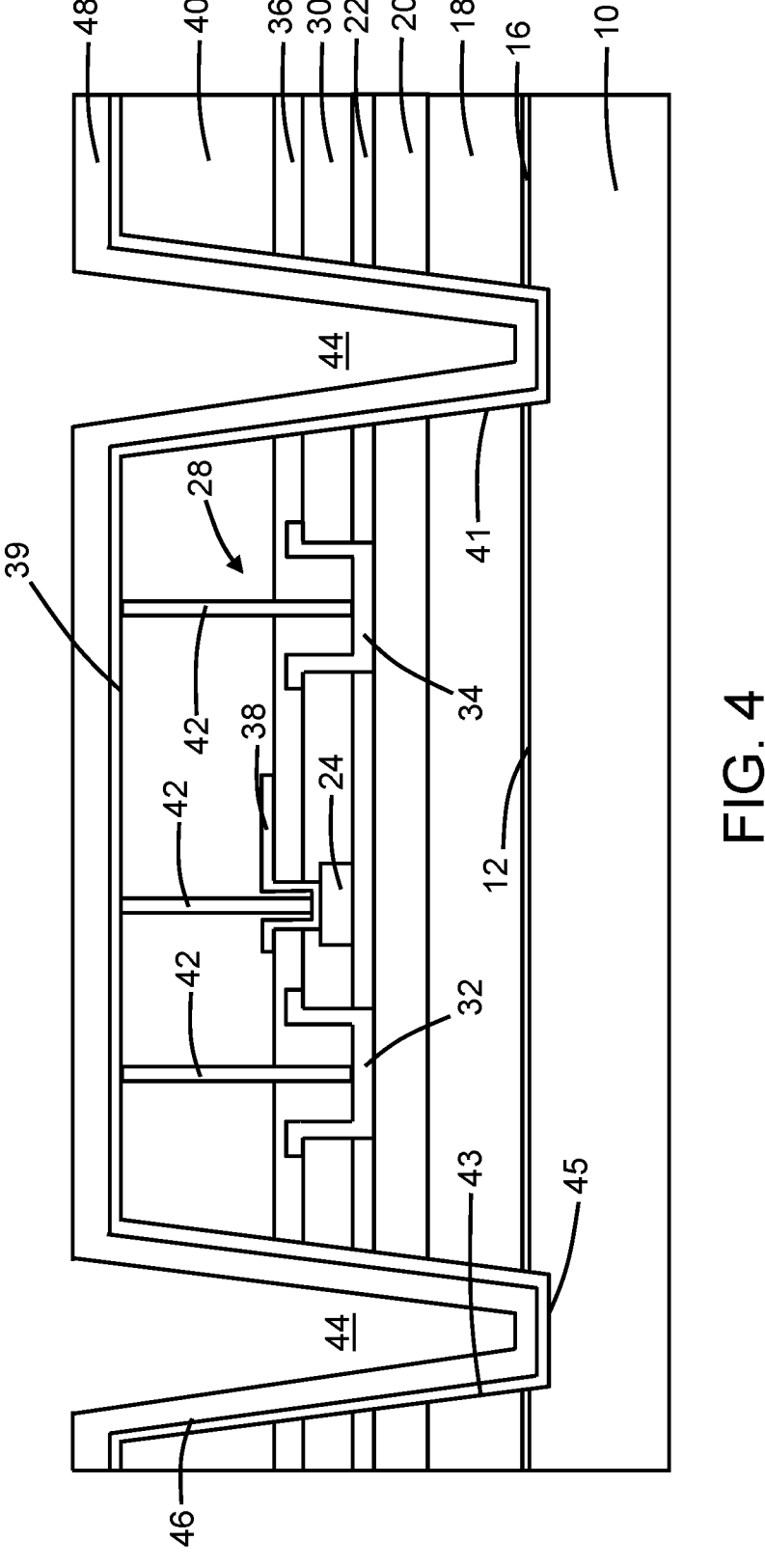
FIG. 4 is a cross-sectional view of the structure at a fabrication stage of the processing method subsequent to FIG. 3.

With reference to FIG. 4 in which like reference numerals refer to like features in FIG. 3 and at a subsequent fabrication stage, a dielectric layer 46 may be formed that includes a portion that conformally coats the trench 44. In an embodiment, the portion of the dielectric layer 46 inside the trench 44 may follow the contour of the sidewalls 41, 43 and bottom 45 of the trench 44 and may have a uniform thickness. In an embodiment, the dielectric layer 46 may be comprised of a dielectric material, such as silicon nitride. Another portion of the dielectric layer 46 may be disposed on the top surface 39 of the dielectric layer 40.

A dielectric layer 48 may be formed that includes a portion that conformally coats the dielectric layer 46 inside the trench 44. In an embodiment, the portion of the dielectric layer 48 may follow the contour of the sidewalls 41, 43 and bottom 45 of the trench 44 and may have a uniform thickness. In an embodiment, the dielectric layer 48 may be comprised of a dielectric material, such as silicon dioxide. The portion of the dielectric layer 46 inside the trench 44 may be disposed between the dielectric layer 48 and the sidewalls 41, 43 of the trench 44, and also between the dielectric layer 48 and the bottom 45 of the trench 44. In an embodiment, the dielectric layer 48 may be thicker than the dielectric layer 46. Another portion of the dielectric layer 48 may be disposed on the portion of the dielectric layer 46 that is located on the top surface 39 of the dielectric layer 40. A portion of the trench 44 is unfilled by the dielectric layers 46, 48.

In an embodiment, the dielectric layers 46, 48 may extend continuously over the high-electron-mobility transistor 28 and the contour of the trench 44, and the dielectric layers 46, 48 may continuously coat the dielectric layer 40 and the trench 44 without any discontinuities. In an embodiment, the portion of the dielectric layer 46 on the top surface 39 of the dielectric layer 40 may function as an etch stop layer of a metallization level of a back-end-of-line stack. In an embodiment, the portion of the dielectric layer 48 on the portion of the dielectric layer 46 that is located on the top surface 39 may function as an interlayer dielectric layer of a metallization level of the back-end-of-line stack.

Figure 5:
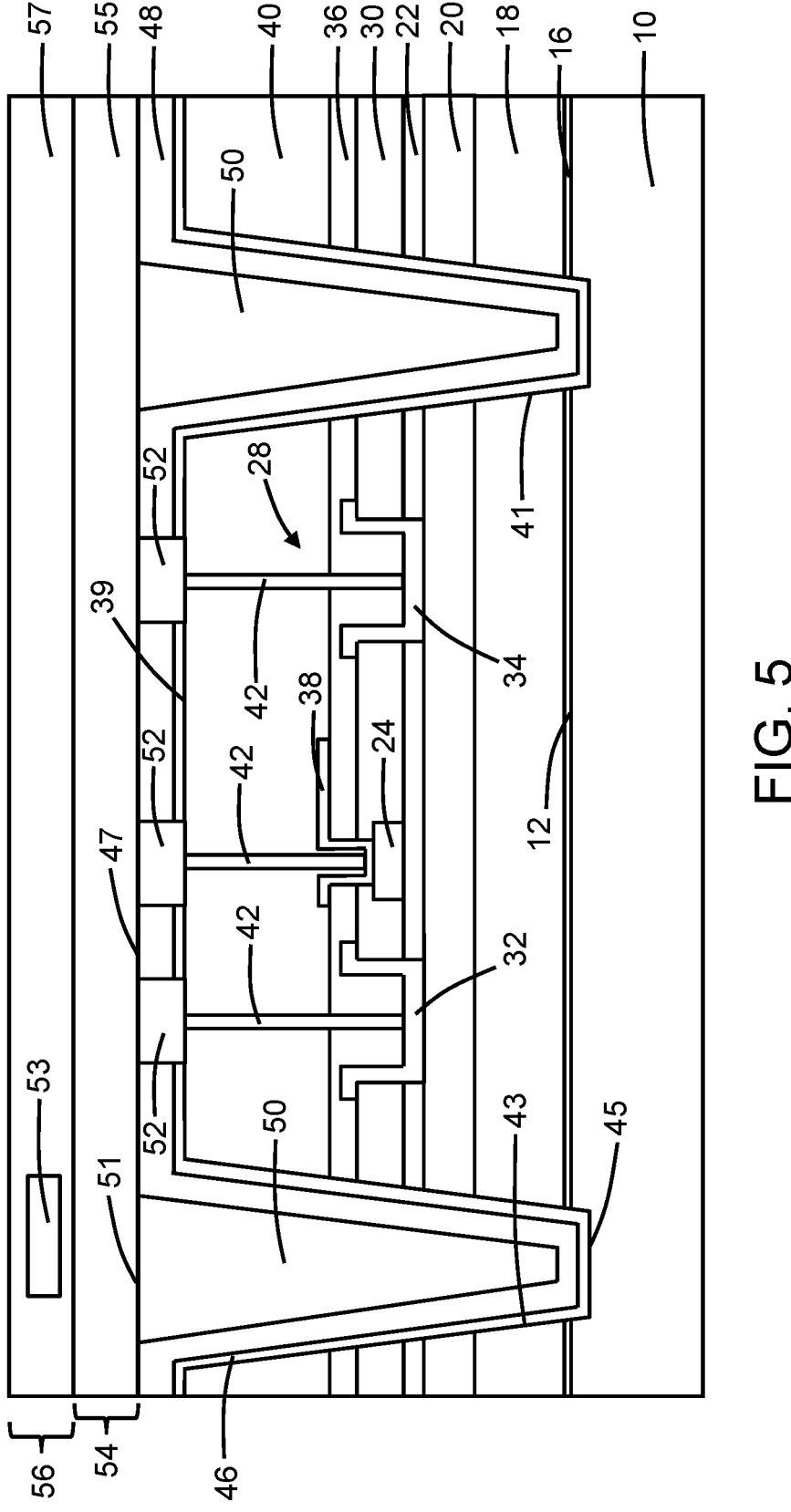
FIG. 5 is a cross-sectional view of the structure at a fabrication stage of the processing method subsequent to FIG. 4.

With reference to FIG. 5 in which like reference numerals refer to like features in FIG. 4 and at a subsequent fabrication stage, a conductor layer 50 may be formed inside the trench 44. In an embodiment, the conductor layer 50 may fully fill the portion of the trench 44 that is unfilled by the dielectric layers 46, 48. In an embodiment, the conductor layer 50 may be comprised of a metal, such as copper. Respective lower portions of the dielectric layers 46, 48 are disposed inside the trench 44 between the layer stack 14 and a lower portion of the conductor layer 50, and respective upper portions of the dielectric layers 46, 48 are disposed inside the trench 44 between the dielectric layers 30, 36, 40 and the upper portion of the conductor layer 50. The lower portion of the dielectric layer 46 is disposed between the lower portion of the dielectric layer 48 and the layer stack 14. The upper portion of the dielectric layer 46 is disposed between the upper portion of the dielectric layer 48 and the dielectric layers 30, 36, 40.

Interconnects 52 may be formed that are coupled by the contacts 42 to the source ohmic contact 32, the drain ohmic contact 34, and the gate metal 38. The interconnects 52 may be formed in interconnect trenches that are patterned by lithography and etching processes in the dielectric layers 46, 48. The interconnects 52 are disposed in the metallization level of the back-end-of-line stack that includes the portions of the dielectric layers 46, 48 disposed in a layer stack on the top surface 39 of the dielectric layer 40. The interconnects 52 may be comprised of a metal, such as copper.

The metal of the conductor layer 50 and the metal of the interconnects 52 may be concurrently deposited into the interconnect trenches in the dielectric layers 46, 48 and the trench 44, and planarized following deposition. The planarization provides the conductor layer 50 with a top surface 51 that is planar. In an embodiment, the top surface 51 may be coplanar with a top surface 47 of the dielectric layer 48.

The dielectric layers 46, 48 and the conductor layer 50 inside the trench 44 may collectively define a seal ring that surrounds the portion of the layer stack 14 including the high-electron-mobility transistor 28. The seal ring may function to prevent the ingress of moisture to the portion of the layer stack 14 including the high-electron-mobility transistor 28, which may be effective to avoid reliability degradation. The conductor layer 50 of the seal ring provides a metal fill that may improve the gap fill capability for the trench 44 such that the depth and aspect ratio of the trench 44 can be increased, which may enable an increase in the thickness of the layer stack 14.

Additional metallization levels 54, 56 of the back-end-of-line stack may be formed over the metallization level that includes the dielectric layer 48. The conductor layer 50 of the seal ring is covered by the additional metallization levels 54, 56. The metallization level 54 may include an interlayer dielectric layer 55 and interconnects (not shown) in the interlayer dielectric layer 55. The metallization level 56 may include an interlayer dielectric layer 57 and interconnects (not shown) in the interlayer dielectric layer 57. The seal ring only extends through the metallization level, which includes the dielectric layers 46, 48 and interconnects 52, of the back-end-of-line stack that is closest to the high-electron-mobility transistor 28. The interlayer dielectric layers 55, 57 of the metallization levels 54, 56 are disposed over and cover the seal ring, and the seal ring is disposed between the interlayer dielectric layers 55, 57 and the substrate 10. The improvement in gap fill may also improve the coplanarity of the top surface 47 of the dielectric layer 48 and the top surface 51 of conductor layer 50 such that a passive device 53, such as a capacitor or an inductor, can be formed above the seal ring in the overlying metallization levels 54, 56.

Figure 6:
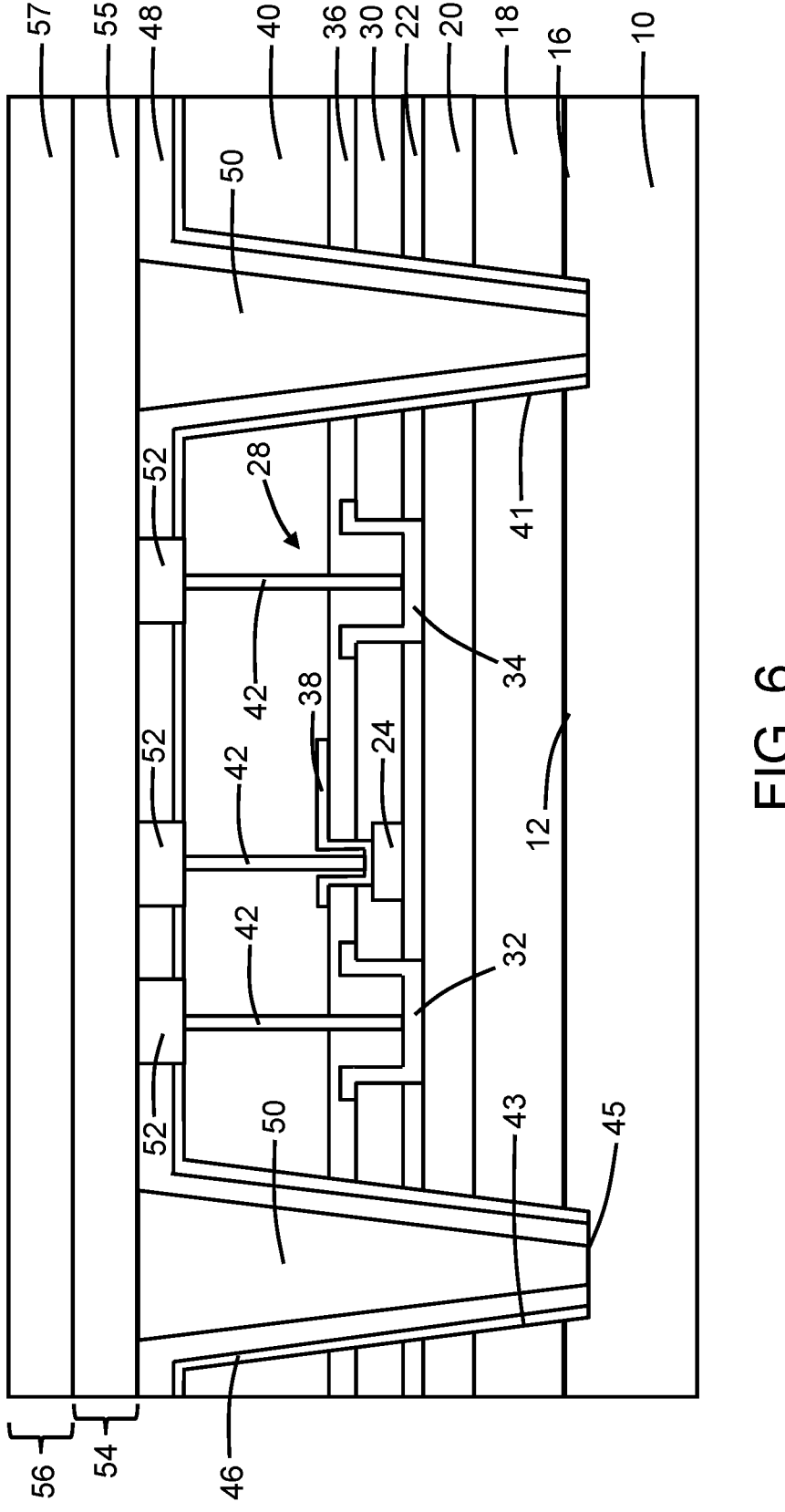
FIG. 6 is a cross-sectional view of a structure in accordance with alternative embodiments of the invention.

With reference to FIG. 6 and in accordance with alternative embodiments, portions of the dielectric layers 46, 48 may be removed from the bottom 45 of the trench 44 before forming the conductor layer 50. In an embodiment, a directional etching process may be employed to remove these portions of the dielectric layers 46, 48. The conductor layer 50 may adjoin the substrate 10 at the bottom 45 of the trench 44, which is exposed by the removal of the portions of the dielectric layers 46, 48, such that the conductor layer 50 of the seal ring is electrically and physically coupled to the substrate 10.

Figure 7:
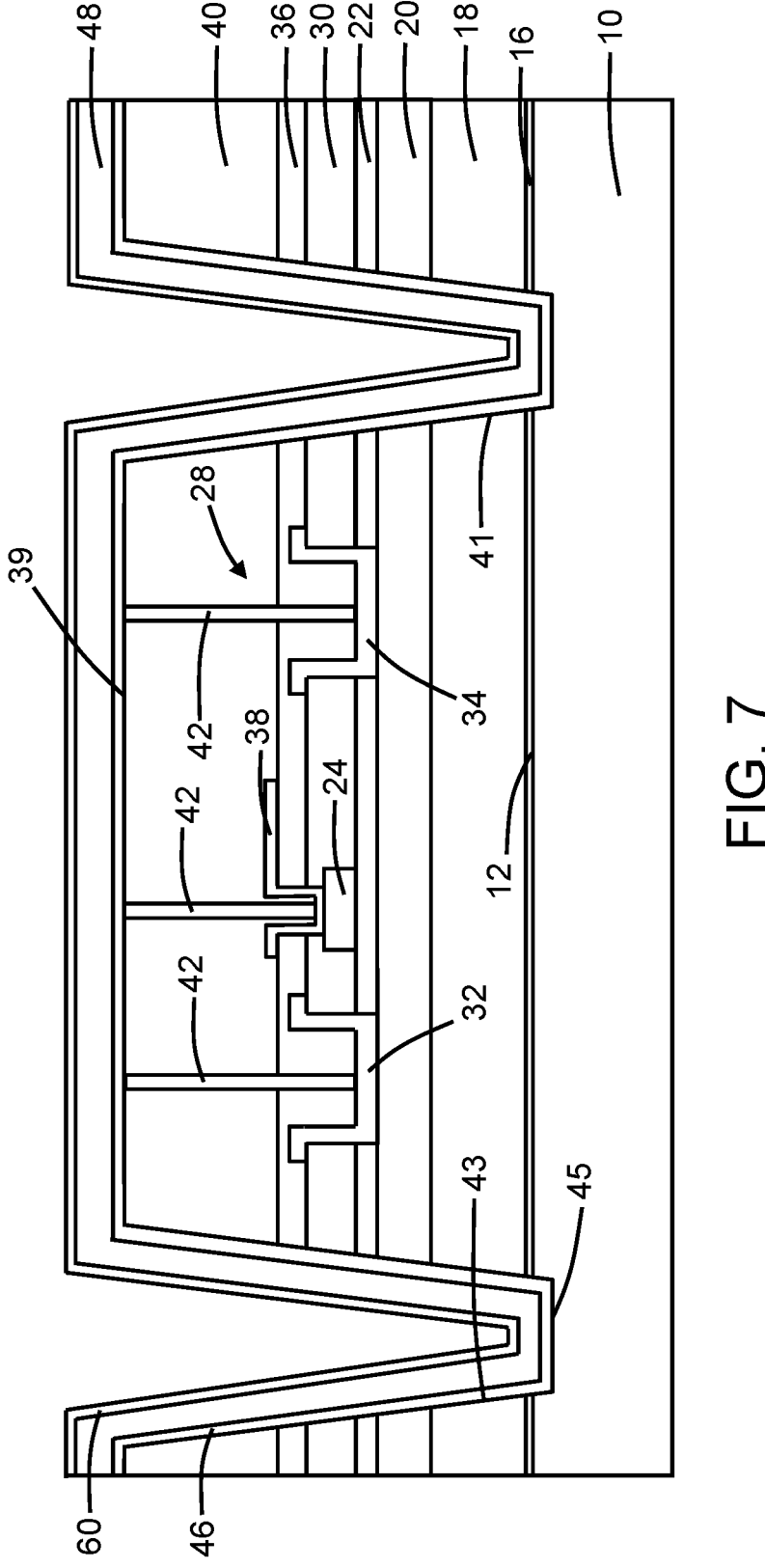
FIG. 7 is a cross-sectional view of a structure at a fabrication stage of a processing method in accordance with alternative embodiments of the invention.

With reference to FIG. 7 and in accordance with alternative embodiments, a dielectric layer 60 may be formed that conformally coats the dielectric layers 46, 48 inside the trench 44. In an embodiment, the dielectric layer 60 may follow the contour of the sidewalls 41, 43 and bottom 45 of the trench 44 and may have a uniform thickness. In an embodiment, the dielectric layer 60 may be comprised of a dielectric material, such as silicon nitride. The dielectric layers 46, 48 may be disposed between the dielectric layer 60 and the sidewalls 41, 43 and bottom 45 of the trench 44. In an embodiment, the dielectric layer 60 may be thinner than the dielectric layer 48. Another portion of the dielectric layer 60 may be disposed on the portions of the dielectric layers 46, 48 that are located on the top surface 39 of the dielectric layer 40.

A portion of the trench 44 is unfilled by the dielectric layers 46, 48 and the dielectric layer 60. In an embodiment, the dielectric layer 60 may extend continuously over the high-electron-mobility transistor 28 and the contour of the trench 44, and the dielectric layer 60 may continuously coat the dielectric layers 46, 48 and the trench 44 without any discontinuities.

Figure 8:
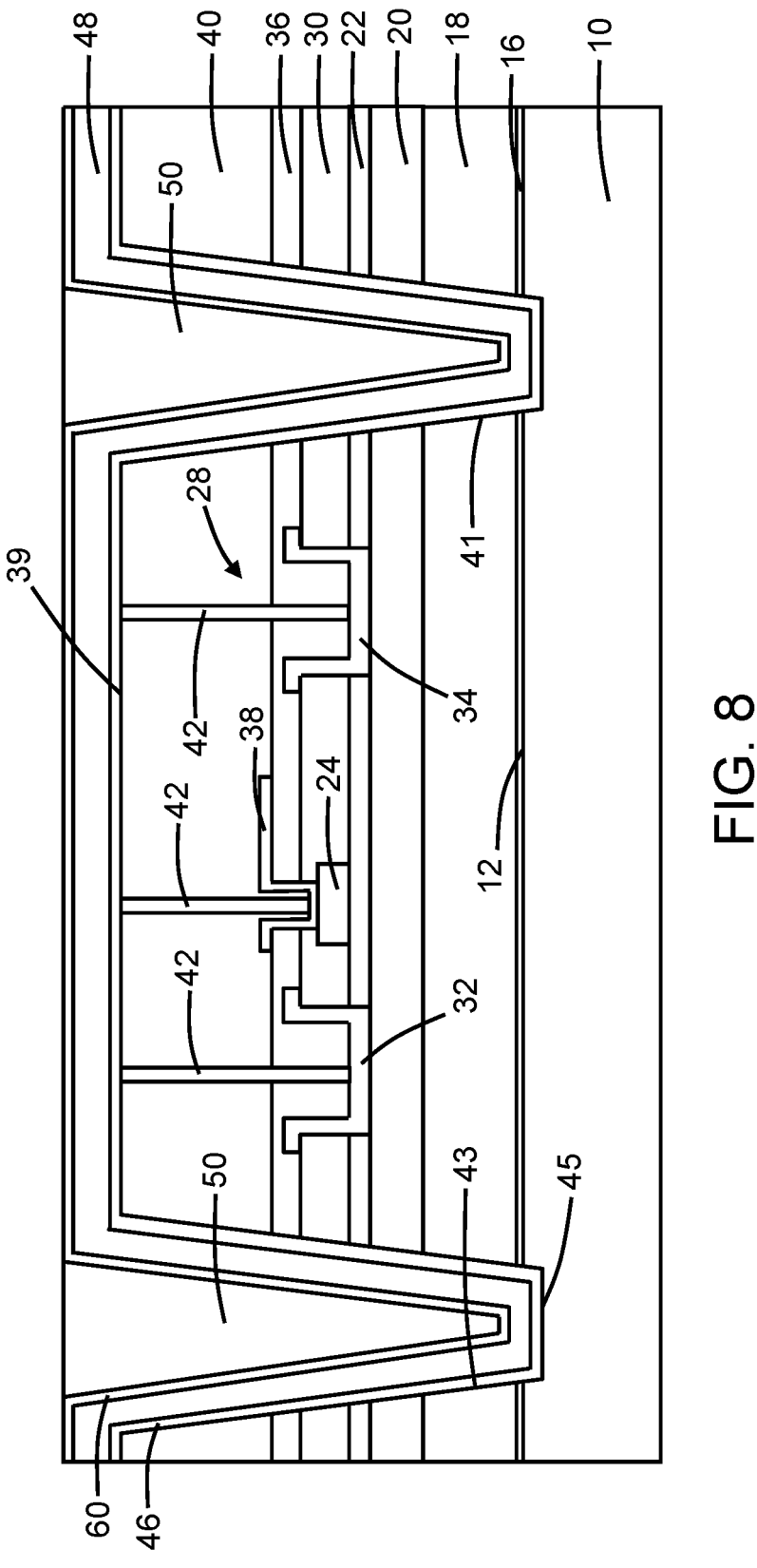
FIG. 8 is a cross-sectional view of the structure at a fabrication stage of the processing method subsequent to FIG. 7.

With reference to FIG. 8 in which like reference numerals refer to like features in FIG. 7 and at a subsequent fabrication stage, the conductor layer 50 may be formed inside the trench 44 after forming the dielectric layer 60. In an embodiment, the conductor layer 50 may fully fill the trench 44. In an embodiment, the conductor layer 50 may be comprised of a metal, such as tungsten. The dielectric layers 46, 48 and dielectric layer 60 may be disposed between the conductor layer 50 and the sidewalls 41, 43 and bottom 45 of the trench 44. In that regard, the dielectric layer 60 includes a lower portion disposed between the lower portion of the dielectric layer 48 and the lower portion of the conductor layer 50, and the dielectric layer 60 includes an upper portion disposed between the upper portion of the dielectric layer 48 and the upper portion of the conductor layer 50. The metal of the conductor layer 50 may be deposited and planarized with reliance upon the dielectric layer 60 as a polish stop.

Figure 9:
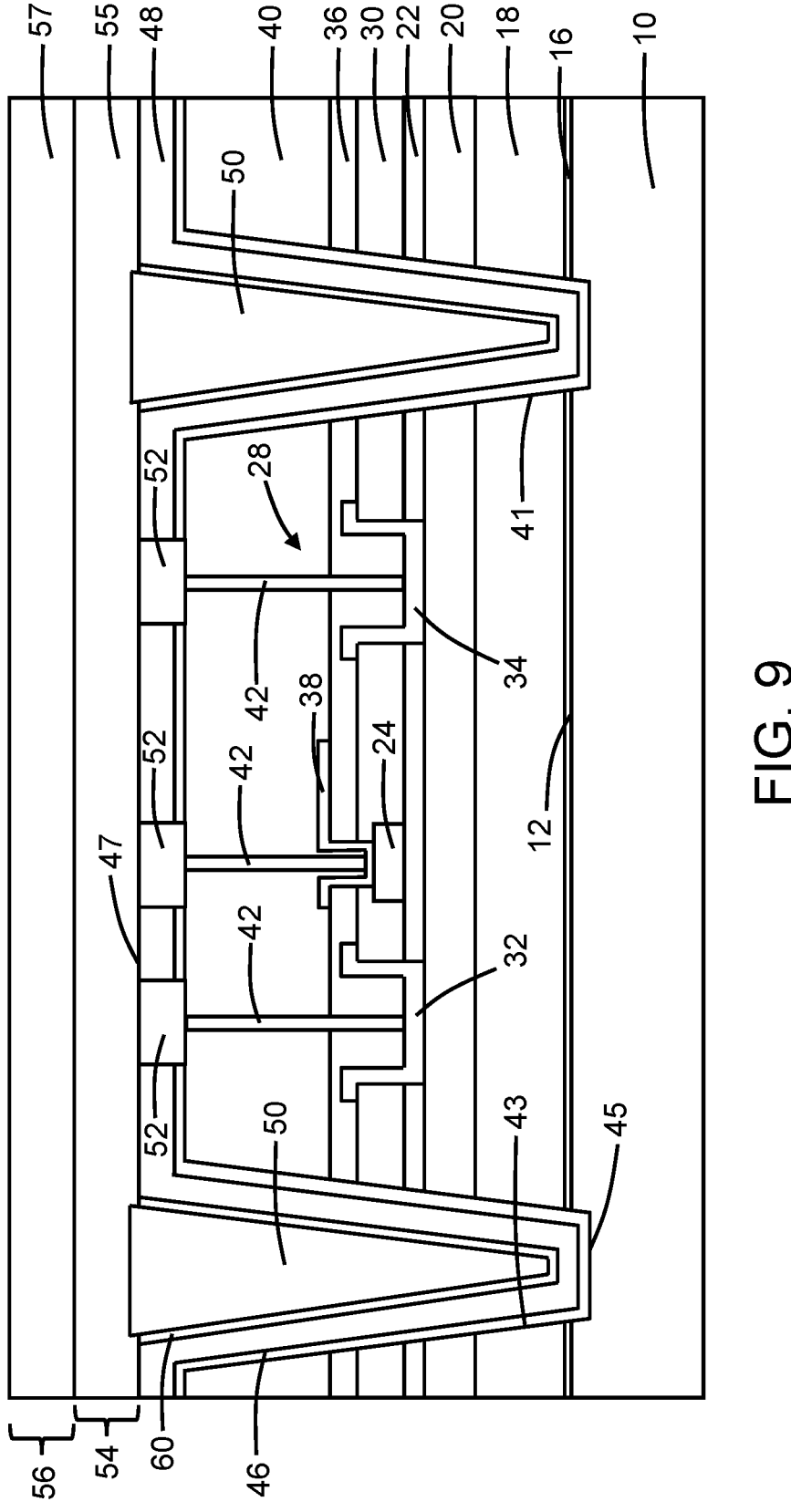
FIG. 9 is a cross-sectional view of the structure at a fabrication stage of the processing method subsequent to FIG. 8.

With reference to FIG. 9 in which like reference numerals refer to like features in FIG. 8 and at a subsequent fabrication stage, the dielectric layer 60 outside of the trench 44 may be removed by an etching process, which results in an upper portion of the conductor layer 50 to project above the top surface 47 of the dielectric layer 48. The interconnects 52 may be formed that are coupled by the contacts 42 to the source ohmic contact 32, the drain ohmic contact 34, and the gate metal 38. In an embodiment, the interconnects 52 may be comprised of a different metal than the conductor layer 50. In an embodiment, the interconnects 52 may be comprised of copper, and the conductor layer 50 may be comprised of tungsten. The additional metallization levels 54, 56 of the back-end-of-line stack may be formed over the dielectric layer 48.

The dielectric layers 46, 48, 60 and the conductor layer 50 inside the trench 44 may collectively define a seal ring that surrounds the portion of the layer stack 14 including the high-electron-mobility transistor 28. The seal ring may function to prevent or reduce the ingress of moisture to the portion of the layer stack 14 including the high-electron-mobility transistor 28, which may be effective to avoid reliability degradation.

In an alternative embodiment, the dielectric layers 46, 48, 60 may be removed from the bottom 45 of the trench 44 before the conductor layer 50 is formed. The conductor layer 50 may contact the substrate 10 at the bottom 45 of the trench 44 and, as a result, the seal ring may also function as a substrate contact.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate;
   a layer stack on the substrate, the layer stack including a plurality of semiconductor layers, and each semiconductor layer comprising a wide band-gap semiconductor material;
   a first dielectric layer on the layer stack;
   a seal ring including a trench that penetrates through the first dielectric layer and the layer stack to the substrate, a second dielectric layer that lines the trench, and a conductor layer including a first portion and a second portion inside the trench, the trench surrounding a portion of the layer stack and a portion of the first dielectric layer, the second dielectric layer including a first portion disposed between the first portion of the conductor layer and the portion of the layer stack, and the second dielectric layer including a second portion disposed between the second portion of the conductor layer and the portion of the first dielectric layer;
   a device structure including a gate on the portion of the layer stack;
   a contact in the portion of the first dielectric layer; and
   a back-end-of-line stack including a first metallization level over the portion of the first dielectric layer, the first metallization level including a first interlayer dielectric layer,
   wherein the first interlayer dielectric layer includes an interconnect that is coupled by the contact to the gate of the device structure, and the second dielectric layer includes a third portion providing the first interlayer dielectric layer.

2. The structure of claim 1 wherein the conductor layer comprises copper.

3. The structure of claim 1 wherein the conductor layer comprises tungsten.

4. The structure of claim 1 wherein the seal ring further includes a third dielectric layer that lines the trench, the third dielectric layer including a first portion disposed between the first portion of the second dielectric layer and the portion of the layer stack, and the third dielectric layer including a second portion is disposed between the second portion of the second dielectric layer and the portion of the first dielectric layer.

5. The structure of claim 4 wherein the second dielectric layer comprises silicon dioxide, and the third dielectric layer comprises silicon nitride.

6. The structure of claim 4 wherein the seal ring further includes a fourth dielectric layer, the fourth dielectric layer includes a first portion disposed between the first portion of the second dielectric layer and the first portion of the conductor layer, and the fourth dielectric layer includes a second portion disposed between the second portion of the second dielectric layer and the second portion of the conductor layer.

7. The structure of claim 6 wherein the second dielectric layer comprises silicon dioxide, and the third dielectric layer and the fourth dielectric layer comprise silicon nitride.

8. The structure of claim 1 wherein the interconnect and the conductor layer comprise different materials.

9. The structure of claim 1 wherein the interconnect and the conductor layer comprise the same material.

10. The structure of claim 1 wherein the back-end-of-line stack includes a second metallization level, and the second metallization level includes a second interlayer dielectric layer dielectric layer over the seal ring and the first interlayer dielectric layer.

11. The structure of claim 1 wherein the second portion of the conductor layer has a planar top surface.

12. The structure of claim 1 further comprising:
a device structure including a gate on the portion of the layer stack,
wherein the portion of the first dielectric layer is disposed over the device structure, and the second dielectric layer continuously coats the first dielectric layer and the trench.

13. A structure comprising:
a substrate;
a layer stack on the substrate, the layer stack including a plurality of semiconductor layers, and each semiconductor layer comprising a wide band-gap semiconductor material;
a first dielectric layer on the layer stack; and
a seal ring including a trench that penetrates through the first dielectric layer and the layer stack to the substrate, a second dielectric layer that lines the trench, and a conductor layer including a first portion and a second portion inside the trench, the trench surrounding a portion of the layer stack and a portion of the first dielectric layer, the second dielectric layer including a first portion disposed between the first portion of the conductor layer and the portion of the layer stack, and the second dielectric layer including a second portion disposed between the second portion of the conductor layer and the portion of the first dielectric layer, wherein the trench has an outer sidewall and an inner sidewall between the outer sidewall and the portion of the layer stack, the outer sidewall and the inner sidewall fully surround the portion of the layer stack, and the second dielectric layer includes a third portion between the first portion of the conductor layer and the substrate at the bottom of the trench.

14. The structure of claim 13 wherein the trench has a bottom in the substrate that extends between the outer sidewall and the inner sidewall, and the trench is tapered with a width that decreases with decreasing distance from the bottom of the trench.

15. The structure of claim 13 wherein the first portion of the conductor adjoins the substrate at the bottom of the trench.

16. The structure of claim 13 further comprising:
a device structure including a gate on the portion of the layer stack; and
a contact in the portion of the first dielectric layer, the contact coupled to the gate of the device structure.

17. The structure of claim 13 further comprising:
a device structure including a gate on the portion of the layer stack;
a contact in the portion of the first dielectric layer; and
a back-end-of-line stack including a metallization level over the portion of the first dielectric layer, the metallization level including an interlayer dielectric layer,
wherein the second dielectric layer includes a third portion providing the interlayer dielectric layer, and the interlayer dielectric layer of the back-end-of-line stack includes an interconnect that is coupled by the contact to the gate of the device structure.

18. The structure of claim 13 wherein the interconnect and the conductor layer comprise the same material.

19. The structure of claim 13 wherein the conductor layer comprises copper.

20. A method comprising:
forming a layer stack on a substrate, wherein the layer stack includes a plurality of semiconductor layers, and each semiconductor layer comprises a wide band-gap semiconductor material;
forming a first dielectric layer on the layer stack;
forming a seal ring including a trench that penetrates through the first dielectric layer and the layer stack to the substrate, a second dielectric layer that lines the trench, and a conductor layer including a first portion and a second portion inside the trench, wherein the trench surrounds a portion of the layer stack and a portion of the first dielectric layer, the second dielectric layer includes a first portion disposed between the first portion of the conductor layer and the portion of the layer stack, and the second dielectric layer includes a second portion disposed between the second portion of the conductor layer and the portion of the first dielectric layer;
forming a device structure including a gate on the portion of the layer stack;
forming a contact in the portion of the first dielectric layer; and
forming a back-end-of-line stack including a first metallization level over the portion of the first dielectric layer, wherein the first metallization level includes an interlayer dielectric layer, the interlayer dielectric layer includes an interconnect that is coupled by the contact to the gate of the device structure, and the second dielectric layer includes a third portion providing the first interlayer dielectric layer.

* * * * *